United States Patent
Chen et al.

(10) Patent No.: US 7,203,072 B2
(45) Date of Patent: Apr. 10, 2007

(54) HEAT DISSIPATING STRUCTURE AND SEMICONDUCTOR PACKAGE WITH THE SAME

(75) Inventors: Chin-Te Chen, Taichung Hsien (TW); Chang-Fu Lin, Taichung Hsien (TW)

(73) Assignee: Siliconware Precision Industries Co., Ltd. (TW)

( * ) Notice: Subject to any disclaimer, the term of this patent is extended or adjusted under 35 U.S.C. 154(b) by 113 days.

(21) Appl. No.: 10/851,288

(22) Filed: May 21, 2004

(65) Prior Publication Data
US 2005/0056926 A1    Mar. 17, 2005

(30) Foreign Application Priority Data
Sep. 15, 2003   (TW) .............................. 92125310 A (51) Int. Cl.
H05K 7/02    (2006.01)
H05K 7/06    (2006.01)
H05K 7/08    (2006.01)
H05K 7/10    (2006.01)

(52) U.S. Cl. ..................... 361/760; 361/709; 361/710; 257/704

(58) Field of Classification Search ........ 361/700–710, 361/816, 818, 719; 257/700–710; 174/16.3; 165/80.3
See application file for complete search history.

(56) References Cited

U.S. PATENT DOCUMENTS

| | | | | |
|---|---|---|---|---|
| 5,473,512 A | * | 12/1995 | Degani et al. | 361/760 |
| 6,191,360 B1 | * | 2/2001 | Tao et al. | 174/52.4 |
| 6,282,096 B1 | * | 8/2001 | Lo et al. | 361/704 |
| 6,552,266 B2 | * | 4/2003 | Carden et al. | 174/535 |
| 6,775,140 B2 | * | 8/2004 | Shim et al. | 361/704 |
| 6,856,015 B1 | * | 2/2005 | Huang et al. | 257/706 |
| 6,919,630 B2 | * | 7/2005 | Hsiao | 257/706 |

* cited by examiner

*Primary Examiner*—Tuan Dinh
(74) *Attorney, Agent, or Firm*—Peter F. Corless; Steven M. Jensen; Edwards Angell Palmer & Dodge LLP (57) ABSTRACT

A heat dissipating structure and a semiconductor package with the same are proposed. A substrate is used to accommodate at least one chip thereon, and the chip is electrically connected to the substrate. A heat dissipating structure having a flat portion and a support portion is mount on the substrate via the support portion by means of an adhesive. At least one groove is formed on the support portion and at least one air vent is formed around the groove to allow the groove to communicate with the outside via the air vent, such that the adhesive is allowed to fill the groove to expel air from the groove to the atmosphere through the air vent, thereby preventing the air from trapped in the groove.

18 Claims, 7 Drawing Sheets

HEAT DISSIPATING STRUCTURE AND SEMICONDUCTOR PACKAGE WITH THE SAME

FIELD OF THE INVENTION

The present invention relates to semiconductor packages, and more particularly, to a semiconductor package with a heat dissipating structure that can be firmly attached to a chip carrier so as to improve the adhesion reliability between the heat dissipating structure and the chip carrier.

BACKGROUND OF THE INVENTION

Flip-chip ball grid array (FCBGA) semiconductor package combines flip-chip and ball-grid-array structures, wherein at least one semiconductor chip is incorporated in a flip-chip manner that an active surface of the chip is electrically connected to a side of a substrate via a plurality of conductive bumps, and a plurality of solder balls are formed on an opposite side of the substrate to serve as input/output (I/O) connections. This FCBGA package desirably has a reduced size and improved electrical performance as not requiring the use of bonding wires, thereby reducing the resistance and preventing signal degradation during transmission, such that the FCBGA package becomes one of the most popular package technologies in the next generation.

Due to the above advantageous characteristics such as the reduced size and improved performance, the FCBGA package is widely used for packaging highly integrated semiconductor chips. Since such highly-integrated chips usually produce a large amount of heat during the high-frequency operation thereof, how to effectively dissipate heat plays a key role in determining the lifetime of the chips and the yield of the fabricated packages.

In order to improve the heat dissipating efficiency for the FCBGA package, it is common to attach at least one embedded heat spreader to the flip chip mounted on the chip carrier such as substrate during package fabrication. This allows heat generated from the flip chip during operation to be transmitted through a non-active surface of the chip to the heat spreader and dissipated, such that the heat does not pass through a poor thermally conductive encapsulation body used for encapsulating the chip, and thus the heat dissipating efficiency of the package is improved.

Figure 6:
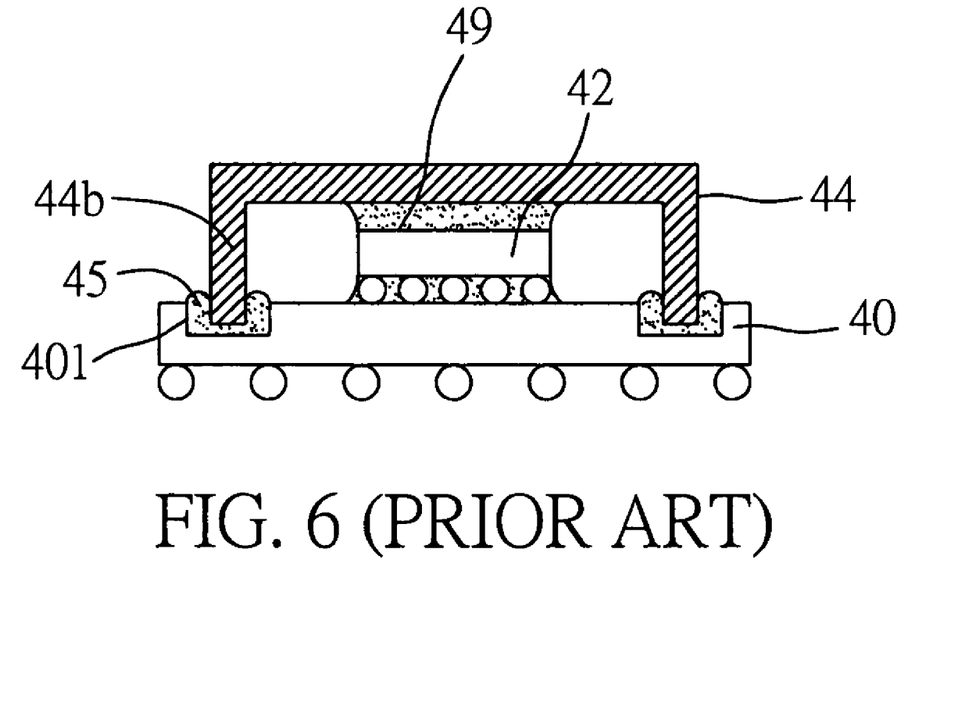
FIG. 6 (PRIOR ART) is a cross-sectional view of a semiconductor package disclosed in U.S. Pat. No. 5,311, 402.

U.S. Pat. No. 5,311,402 discloses a semiconductor package with a heat spreader. As shown in FIG. 6, a substrate 40 is formed with an area for accommodating a chip 42 and a plurality of grooves 401 thereon. The heat spreader 44 is attached to the substrate 40 via an adhesive 45 filled in the grooves 401, wherein a plurality of support portions 44b of the heat spreader 44 are respectively inserted in the corresponding grooves 401, such that the heat spreader 44 is secured in position on the substrate 40 by means of the adhesive 45. This method to insert the support portions 44b in the grooves 401 desirably increases the contact area between the heat spreader 44 and the substrate 40, thereby avoiding a problem that the bonding strength would be reduced due to insufficient contact area. However, forming grooves 401 on the substrate 40 not only complicates the fabrication processes and increases the fabrication cost, but also damages the structure of the substrate 40 thereby easily leading to a reliability issue.

Accordingly, there is developed an alternative method to form grooves on the support portions of the heat spreader instead of on the substrate. As shown in a semiconductor package of FIG. 7, besides areas for accommodating a chip 52 and conductive traces, one or more heat spreader bonding areas 500 are defined on a substrate 50 for mounting a heat spreader 54. The heat spreader 54 comprises a flat portion 54a and a plurality of support portions 54b for supporting the flat portion 54a above the chip 52. One or more grooves 57 are formed on the support portions 54b at areas for contacting the heat spreader bonding areas 500 on the substrate 50. This allows a fluid adhesive 55 to be filled into the grooves 57 and between the support portions 54b and the heat spreader bonding areas 500 so as to firmly attach the heat spreader 54 to the substrate 50 when the adhesive 55 is cured.

Figure 7:
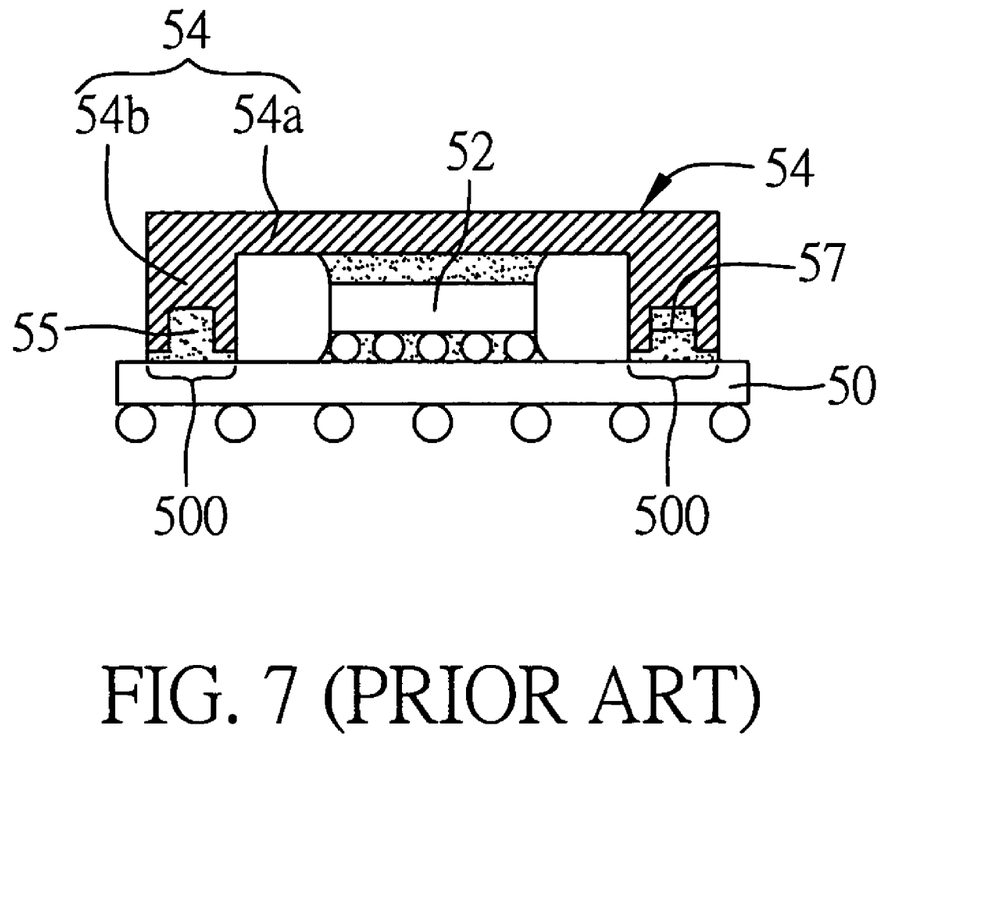
FIG. 7 (PRIOR ART) is a cross-sectional view of a conventional semiconductor package having a heat spreader formed with grooves thereon.

Forming grooves 57 on the support portions 54b of the heat spreader 54 for receiving the adhesive 55 desirably provides an anchoring effect to enhance the bonding strength between the heat spreader 54 and the substrate 50. However, the adhesive 55 filled into the grooves 57 seals the grooves 57, and makes air trapped in the groove 57 and not able to be dissipated. As a result, during temperature cycles of subsequent fabrication processes, the air trapped in the grooves 57 would cause a popcorn effect that reduces the adhesion reliability between the heat spreader 54 and the substrate 50.

Moreover, it is difficult to observe from the appearance and examine the amount of adhesive filled in the grooves. If an excess amount of adhesive is applied, the adhesive would contaminate the substrate. On the contrary, if the amount of adhesive used is insufficient, it results in air trapped in the grooves and causes the popcorn effect.

Therefore, the problem to be solved here is to provide a heat dissipating structure for use in a semiconductor package, which allows an amount of adhesive used for the heat dissipating structure to be determined from the appearance of the heat dissipating structure.

SUMMARY OF THE INVENTION

In light of the above drawbacks of the prior arts, a primary objective of the present invention is to provide a heat dissipating structure and a semiconductor package with the same, allowing air in one or more grooves on a support portion of the heat dissipating structure to be dissipated so as to improve the adhesion reliability between the heat dissipating structure and a substrate on which the heat dissipating structure is mounted.

Another objective of the present invention is to provide a heat dissipating structure and a semiconductor package with the same, which can prevent air from trapped in one or more grooves formed on a support portion of the heat dissipating structure thereby assuring the reliability of fabrication processes of the semiconductor package, and the semiconductor package is cost-effective to fabricate.

Still another objective of the present invention is to provide a heat dissipating structure and a semiconductor package with the same, allowing an amount of adhesive applied for attaching the heat dissipating structure to a substrate in the semiconductor package to be accurately examined.

A further objective of the present invention is to provide a heat dissipating structure and a semiconductor package with the same, wherein a support portion of the heat dissipating structure is formed with one or more grooves and at least one air vent for dissipating air in the grooves, so as to improve the adhesion reliability between the heat dissipating structure and a substrate on which the heat dissipating structure is mounted.

In order to achieve the foregoing and other objectives, the present invention provides a semiconductor package with a heat dissipating structure, comprising: a substrate; at least one semiconductor chip mounted on and electrically connected to the substrate; a heat dissipating structure having a flat portion, and at least one support portion integrally formed with the flat portion and for supporting the flat portion above the semiconductor chip, wherein at least one groove is formed on the support portion at a position to be in contact with the substrate, and at least one air vent is formed around the groove, allowing the groove to communicate with the outside via the air vent; and an adhesive applied in the groove and air vent, for attaching the heat dissipating structure to the substrate.

The groove comprises a single ring-shaped recess or a plurality of concave openings. The groove has a cross-sectional shape depending on a stamping tool used, which can be a square, V shape, semicircle or other shapes.

The air vents are formed transversely across the groove formed on the support portion of the heat dissipating structure and provide an external connection pathway to allow the groove to communicate with the outside via the air vents, such that when the adhesive is filled in the groove, air in the groove can be expelled by the adhesive to the outside via the air vents. This prevents the air from trapped in the groove and prevents the occurrence of a popcorn effect caused by the trapped air during a temperature cycle of subsequent fabrication processes; the popcorn effect would undesirably damage the adhesion reliability between the heat dissipating structure and the substrate. In addition, further by provision of the air vents, packaging operators can easily examine whether an appropriate amount of the adhesive is used by observing if the adhesive flashes to the exits of air vents. In other words, if there is flash of the adhesive observed outside the air vents, it indicates that an excessive amount of the adhesive is applied. This thereby allows the used amount of the adhesive to be accurately controlled.

BRIEF DESCRIPTION OF THE DRAWINGS

The present invention can be more fully understood by reading the following detailed description of the preferred embodiments, with reference made to the accompanying drawings, wherein.

DETAILED DESCRIPTIONS OF THE PREFERRED EMBODIMENTS

Figure 1A:
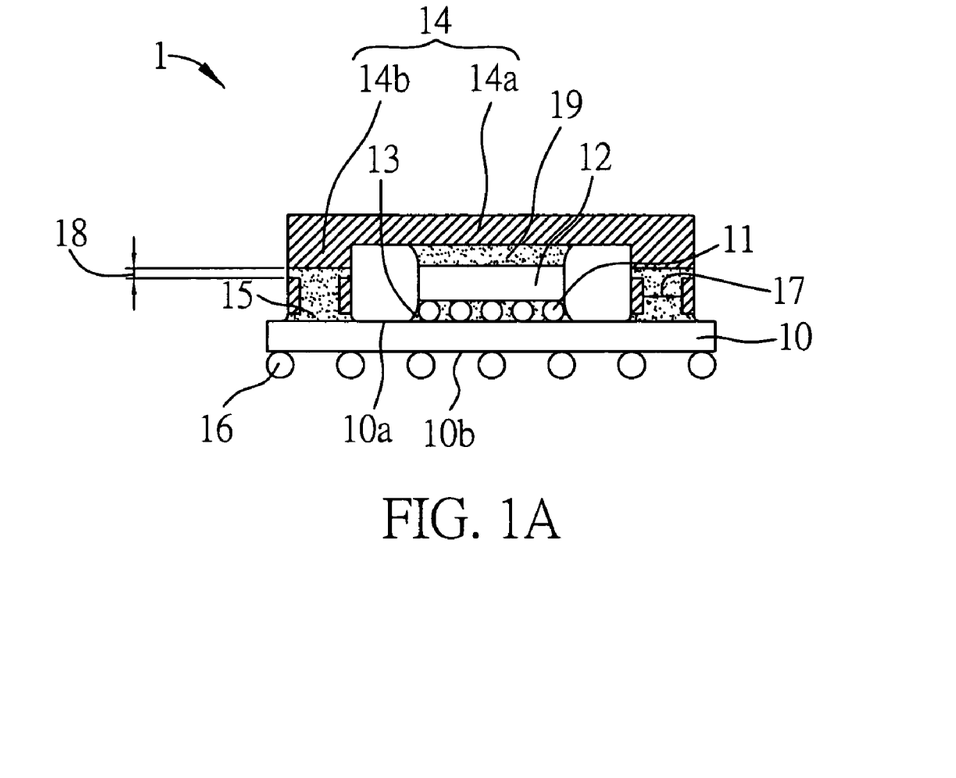
FIG. 1A is a cross-sectional view of a semiconductor package with a heat dissipating structure in accordance with the present invention.

First, referring to FIG. 1A showing a cross-sectional view of a semiconductor package according to a preferred embodiment of the present invention, which is preferably a flip-chip ball grid array (FCBGA) package comprising: a substrate 10 used as a chip carrier; a semiconductor chip 12 mounted on a first surface 10a of the substrate 10 and electrically connected to the substrate 10 via a plurality of conductive bumps 11; an underfill insulating material 13 applied around the conductive bumps 11; a heat dissipating structure 14 mounted on the first surface 10a of the substrate 10; an adhesive 15 applied between the heat dissipating structure 14 and the first surface 10a of the substrate 10; and a plurality of solder balls 16 formed on a second surface 10b of the substrate 10 and electrically connected to the conductive bumps 11. The heat dissipating structure 14 comprises a flat portion 14a and a support portion 14b extending from the periphery of the flat portion 14a toward the substrate 10, allowing the heat dissipating structure 14 to be attached to the first surface 10a of the substrate 10 via the support portion 14b. A groove 17 is formed on a bottom surface of the support portion 14b, wherein the groove 17 may comprise a single ring-shaped recess 17a (FIG. 2A) or a plurality of concave openings 17b (FIG. 2B). At least one air vent 18 is provided on the side of the support portion 14b and transversely crosses the groove 17 so as to connect the groove 17 to the outside.

The heat dissipating structure 14 can be made of copper coated with nickel. The beat dissipating structure 14 comprises a flat portion 14a, and a support portion 14b integrally formed with the flat portion 14a and for supporting the flat portion 14a above the chip 12. The flat portion 14a has a thickness of approximately 20–40 mils, and the support portion 14b has a height of approximately 10–40 mils, wherein the height of the support portion 14b depends on the thickness of the chip or the number of chips stacked together. Further, the flat portion 14a of the heat dissipating structure 14 can be directly attached to the chip 12 via a thermally conductive adhesive 19, such that heat generated from the chip 12 can be easily transmitted to the heat dissipating structure 14 via the thermally conductive adhesive 19 and dissipated.

Figure 2A:
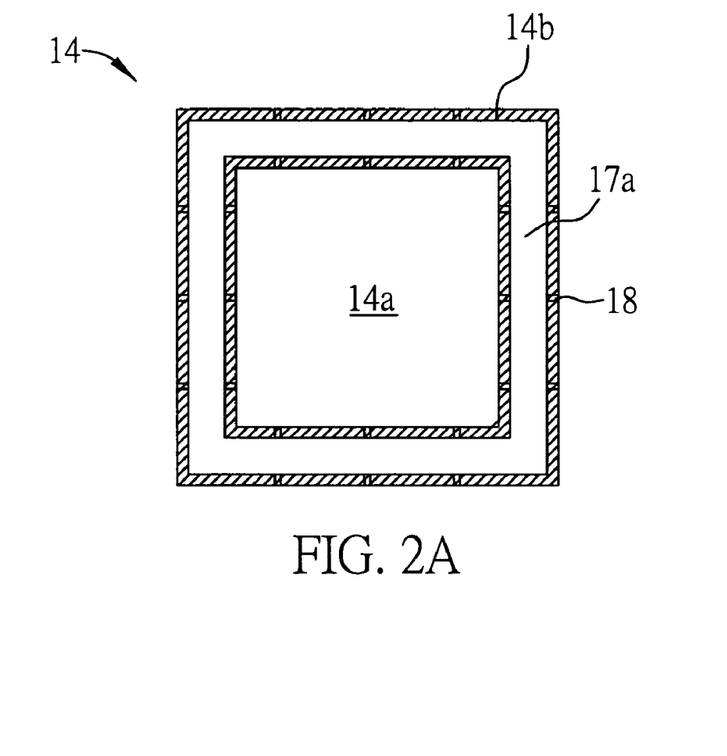
FIG. 2A is a bottom view of the heat dissipating structure in accordance with a preferred embodiment of the present invention.
Figure 2B:
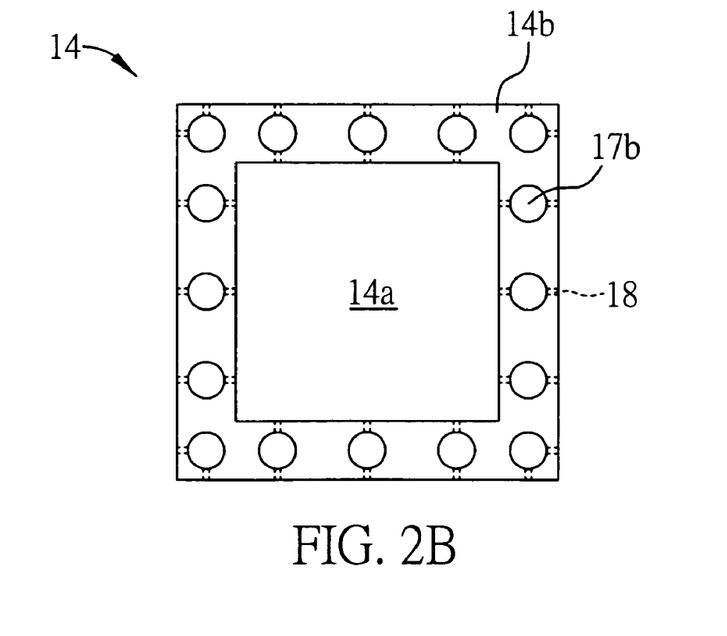
FIG. 2B is a bottom view of the heat dissipating structure in accordance with another preferred embodiment of the present invention.

FIG. 2A shows a bottom view of the heat dissipating structure in accordance with the present invention. In this embodiment, the heat dissipating structure 14 is shaped as a square, and from the bottom view thereof, the support portion 14b is provided with a recess 17a shaped as a square ring. Moreover, one or more air vents 18 are formed transversely across the recess 17a to allow the recess 17a to communicate with the outside via the air vents 18. As a result, when the support portion 14b of the heat dissipating structure 14 is attached to the adhesive 15 applied on the first surface 10a of the substrate 10, the adhesive 15 can successfully fill the recess 17a of the support portion 14b and expel air from the recess 17a to the outside side via the air vents 18. Thereby the recess 17a and the air vents 18 are filled with the adhesive 15. The adhesive 15 may be a fluid adhesive such as silver paste, epoxy resin and so on. In this embodiment, the adhesive 15 is preferably silver paste.

FIG. 2B shows the heat dissipating structure 14 according to another preferred embodiment, which differs from the above embodiment in that a plurality of concave openings 17b are formed on the bottom surface of the support portion 14b, and one or more air vents 18 are provided for each concave opening 17b to allow the concave opening 17b to communicate with the outside via the air vents 18. Similarly, such structured support portion 14b allows the silver paste to completely fill the concave openings 17b and expel air from the concave openings 17b to the outside via the air vents 18, thereby preventing the air from trapped in the concave openings 17b. And the concave openings 17b and the air vents 18 are filled with the adhesive 15.

Figure 1B:
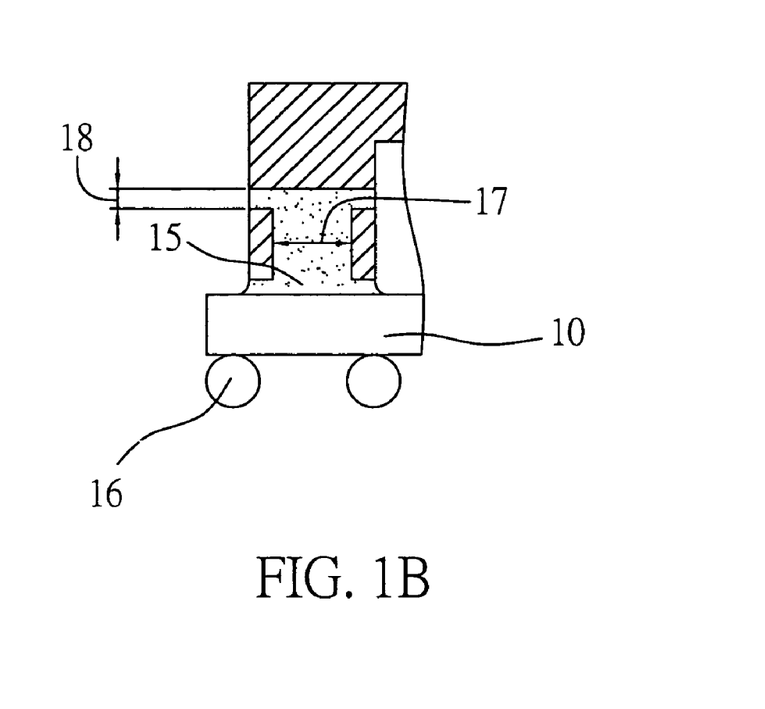
FIG. 1B is another cross-sectional view of the semiconductor package in accordance with the present invention.

After a baking process is performed to cure the adhesive 15, as shown in FIG. 1B, the cured adhesive 15 in the air vents 18 provides a locking effect, and the arrangement or distribution of the groove 17 and air vents 18 (shown in FIGS. 2A and 2B) makes the locking effect from the adhesive 15 to the heat dissipating structure 14 more evenly exerted, thereby enhancing the adhesion force between the adhesive 15 and the heat dissipating structure 14 and preventing the heat dissipating structure 14 from delaminated from the substrate 10 due to external shock, such that the adhesion reliability between the heat dissipating structure 14 and the substrate 10 is improved.

Figure 3A:
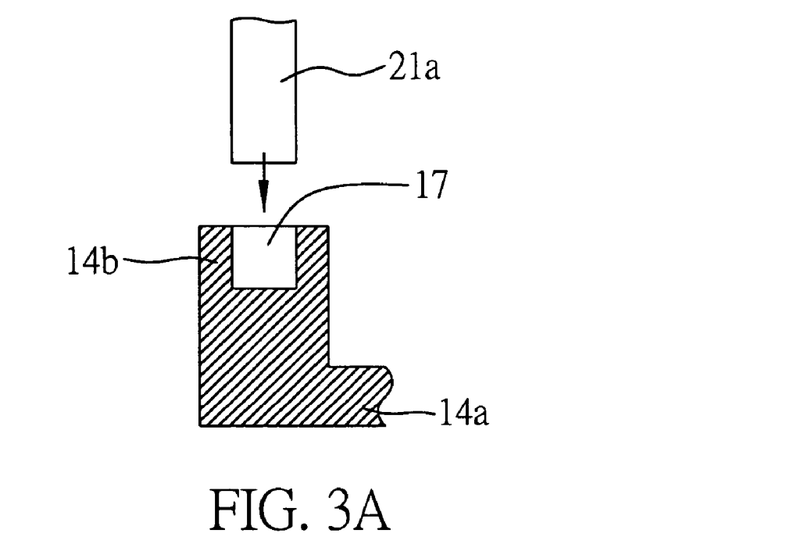
FIG. 3A is a schematic diagram of a groove formed on a support portion of the heat dissipating structure in accordance with a first preferred embodiment of the present invention.
Figure 3B:
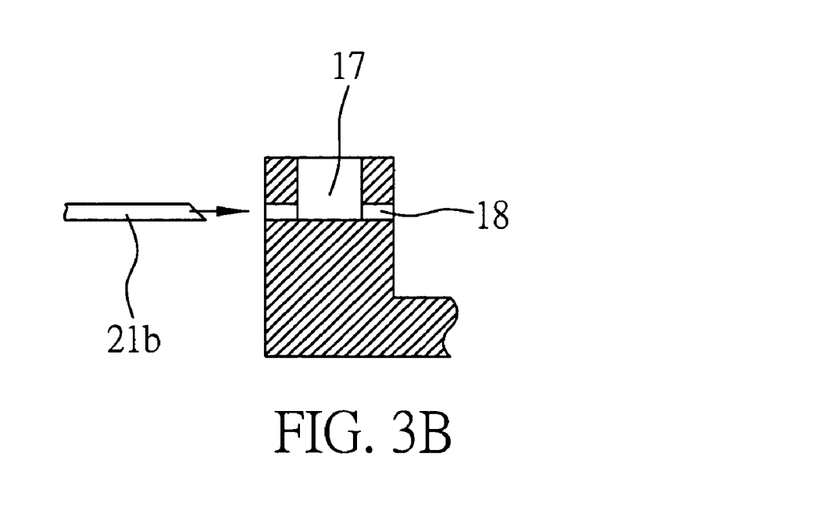
FIG. 3B is a schematic diagram of an air vent formed across the groove on the support portion of the heat dissipating structure in accordance with the first preferred embodiment of the present invention.

On the other hand, the groove 17 shown in FIG. 3A can be formed by stamping with a square punch 21a to shape the groove 17 as a square in a cross-sectional view. Then, the air vents 18 can be formed by penetrating with a pin punch 21b as shown in FIG. 3B. This method allows formation of the groove 17 and air vents 18 of the heat dissipating structure 14 to be simply and cost-effectively achieved.

Figure 4A:
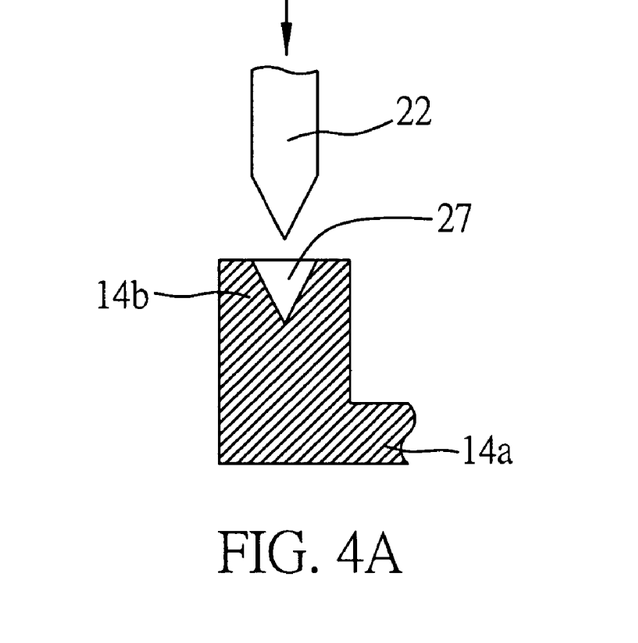
FIG. 4A is a schematic diagram of the groove formed on the support portion of the heat dissipating structure in accordance with a second preferred embodiment of the present invention.
Figure 4B:
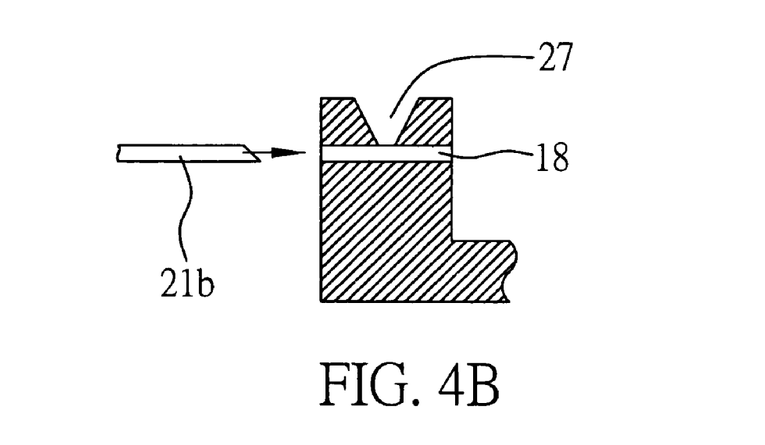
FIG. 4B is a schematic diagram of the air vent formed across the groove on the support portion of the heat dissipating structure in accordance with the second preferred embodiment of the present invention.
Figure 5A:
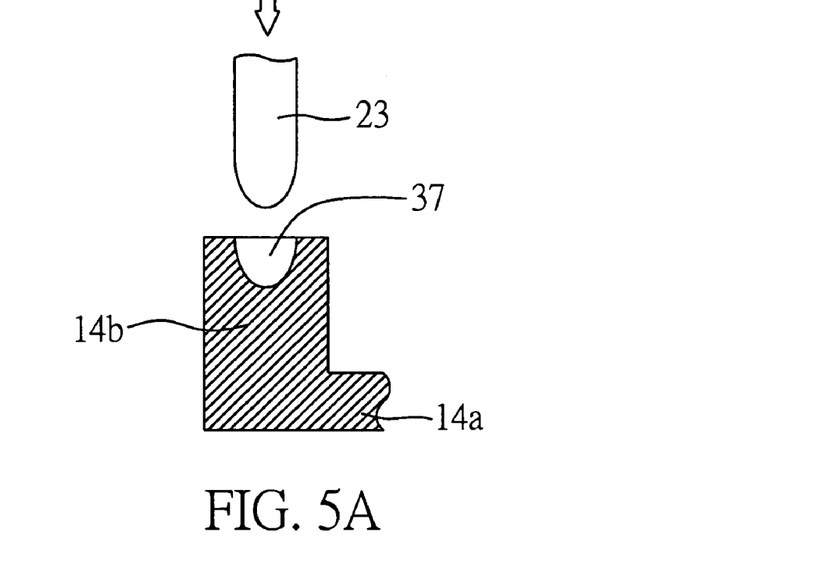
FIG. 5A is a schematic diagram of the groove formed on the support portion of the heat dissipating structure in accordance with a third preferred embodiment of the present invention.
Figure 5B:
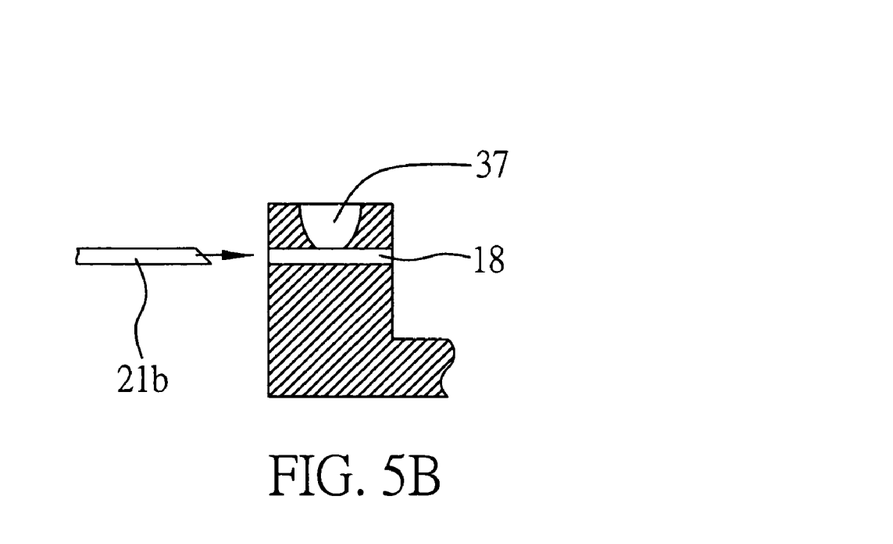
FIG. 5B is a schematic diagram of the air vent formed across the groove on the support portion of the heat dissipating structure in accordance with the third preferred embodiment of the present invention.

However, it should be understood that the cross-sectional shape of the groove 17 is not limited to the above square shape. As shown in FIGS. 4A and 4B, a triangular punch 22 instead of the above square punch 21a may be used to form a V-shaped groove 27, and the air vents 18 shown in 4B are formed using the pin punch 21b. As shown FIGS. 5A and 5B, alternatively, a circular punch 23 can be used to form a semicircular groove 37, and the air vents 18 are similarly formed using the pin punch 21b. These differently shaped grooves can also achieve the intended effects of the present invention.

Thus, the air vents transversely across the groove formed on the support portion of the heat dissipating structure provide an external connection pathway to allow the groove to communicate with the outside via the air vents, such that when the adhesive is filled in the groove, air in the groove can be expelled by the adhesive to the outside via the air vents. This prevents the air from trapped in the groove and prevents the occurrence of a popcorn effect caused by the trapped air during temperature cycles of subsequent fabrication processes; the popcorn effect would undesirably damage the adhesion reliability between the heat dissipating structure and the substrate. In addition, further by provision of the air vents, packaging operators can easily examine whether an appropriate amount of the adhesive is used by observing if the adhesive flashes to the exits of air vents. In other words, if there is flash of the adhesive observed outside the air vents, it indicates that an excessive amount of the adhesive is applied. This thereby allows the used amount of the adhesive to be accurately controlled.

Furthermore, with provision of the groove and air vents on the heat dissipating structure, the adhesive after being cured can provide anchoring and locking effects for the heat dissipating structure to further enhance the adhesion reliability between the heat dissipating structure and the substrate and prevent the heat dissipating structure from delaminated from the substrate due to external shock or mismatch in coefficient of thermal expansion (CTE) between materials respective for making the heat dissipating structure and the substrate.

The invention has been described using exemplary preferred embodiments. However, it is to be understood that the scope of the invention is not limited to the disclosed embodiments. On the contrary, it is intended to cover various modifications and similar arrangements. The scope of the claims, therefore, should be accorded the broadest interpretation so as to encompass all such modifications and similar arrangements.

What is claimed is:

1. A semiconductor package with a heat dissipating structure, comprising:
    a substrate;
    at least one semiconductor chip mounted on and electrically connected to the substrate;
    the heat dissipating structure having a flat portion, and at least one support portion integrally fanned with the flat portion and for supporting the flat portion above the semiconductor chip, wherein at least one groove is formed on the support portion at a position to be in contact with the substrate, and at least one air vent is fanned around the groove, allowing the groove to communicate with the outside via the air vent; and
    an adhesive applied in the groove and air vent, for attaching the heat dissipating structure to the substrate.

2. The semiconductor package of claim 1, wherein the semiconductor package is a flip-chip ball grid may (FCBGA) package.

3. The semiconductor package of claim 1, wherein the groove structure comprises a ring-shaped recess.

4. The semiconductor package of claim 1, wherein the groove structure comprises a plurality of concave openings.

5. The semiconductor package of claim 1, wherein the groove has a cross-sectional shape of a square.

6. The semiconductor package of claim 1, wherein the groove has a cross-sectional shape of a V shape.

7. The semiconductor package of claim 1, wherein the groove has a cross-sectional shape of a semicircle.

8. The semiconductor package of claim 1, wherein the groove is stamped with a stamping head.

9. The semiconductor package of claim 1, wherein the air vent is formed transversely across the groove.

10. The semiconductor package of claim 1, wherein the adhesive is a silver paste.

11. A heat dissipating structure for a semiconductor package, comprising:
   a flat portion;
   at least one support portion integrally formed with the flat portion and for supporting the flat portion above a chip incorporated in the semiconductor package, wherein at least one groove is formed on the support portion at a position to be in contact with a substrate of the semiconductor package, and at least one air vent is formed around the groove, allowing the groove to communicate with the outside via the air vent; and
   an adhesive filled into the groove and the air vent for adhering the heat dissipating structure to the substrate.

12. The boat dissipating structure of claim 11, wherein the groove comprises a ring-shaped recess.

13. The heat dissipating structure of claim 11, wherein the groove comprises a plurality of concave openings.

14. The heat dissipating structure of claim 11, wherein the groove has a cross-sectional shape of a square.

15. The heat dissipating structure of claim 11, wherein the groove bag a cross-sectional shape of a V shape.

16. The heat dissipating structure of claim 11, wherein the groove has a cross-sectional shape of a semicircle.

17. The heat dissipating structure of claim 11, wherein the groove is formed by stamping wit a stamping head.

18. The heat dissipating structure of claim 1, wherein the air vent is formed transversely across the groove.

* * * * *